United States Patent
Sharp et al.

(10) Patent No.: US 7,505,742 B2
(45) Date of Patent: *Mar. 17, 2009

(54) BATTERY LIFE EXTENDING TECHNIQUE FOR MOBILE WIRELESS APPLICATIONS USING BIAS LEVEL CONTROL

(75) Inventors: Steven J. Sharp, Portland, OR (US); Stewart S. Taylor, Beaverton, OR (US); Samuel W. Hammone, Beaverton, OR (US); Ronald R. Ruebusch, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 875 days.

This patent is subject to a terminal disclaimer.

(21) Appl. No.: 10/822,106

(22) Filed: Apr. 9, 2004

(65) Prior Publication Data
US 2004/0192408 A1    Sep. 30, 2004

Related U.S. Application Data

(63) Continuation of application No. 09/664,878, filed on Sep. 19, 2000, now Pat. No. 6,757,526, which is a continuation of application No. 08/843,107, filed on Apr. 25, 1997, now Pat. No. 6,148,220.

(51) Int. Cl.
*H01Q 11/12* (2006.01)
*H04B 1/04* (2006.01)

(52) U.S. Cl. .................. 455/127.1; 455/126; 330/285; 330/297

(58) Field of Classification Search .............. 455/91, 455/116, 115.1–115.4, 127.1–127.5, 126, 455/527, 572; 330/285, 297, 129, 296, 300, 330/291, 278
See application file for complete search history.

(56) References Cited

U.S. PATENT DOCUMENTS

| | | | |
|---|---|---|---|
| 3,109,992 A | 11/1963 | Elliott | |
| 3,274,505 A | 9/1966 | Frisch et al. | |
| 3,374,442 A | 3/1968 | Griffin | |
| 3,967,207 A | 6/1976 | Wheatley, Jr. | |
| 4,442,407 A * | 4/1984 | Apel | 330/128 |
| 4,523,155 A | 6/1985 | Walczak et al. | |
| 4,578,648 A | 3/1986 | Werrbach | |
| 4,636,741 A | 1/1987 | Mitzlaff | |
| 4,760,347 A * | 7/1988 | Li et al. | 330/127 |
| 4,794,343 A | 12/1988 | Yang | |

(Continued)

FOREIGN PATENT DOCUMENTS

WO    WO 96/33555    10/1996

*Primary Examiner*—Tuan A Tran
(74) *Attorney, Agent, or Firm*—Zimmermann & Partner

(57) ABSTRACT

An operating voltage applied to a transmitter's power amplifier in a mobile wireless transceiver is dynamically controlled so as to improve the efficiency of the transmitter at all output power levels. In one embodiment, the bias current levels within the transmitter are also varied to optimize the efficiency of the transmitter at all output power levels. In a preferred embodiment, a highly efficient switching regulator is controlled by a control circuit to adjust the operating voltage and/or bias current for the power amplifier in the transmitter. The control circuit has as its input any of a variety of signals which reflect the actual output power of the transmitter, the desired output power, or the output voltage swing of the transmitter.

4 Claims, 6 Drawing Sheets

U.S. PATENT DOCUMENTS

| | | | |
|---|---|---|---|
| 4,994,757 A * | 2/1991 | Bickley et al. | 330/285 |
| 5,030,922 A | 7/1991 | Rumreich et al. | |
| 5,081,425 A | 1/1992 | Jackson et al. | |
| 5,081,713 A * | 1/1992 | Miyazaki | 455/76 |
| 5,126,688 A | 6/1992 | Nakanishi et al. | |
| 5,129,098 A * | 7/1992 | McGirr et al. | 455/69 |
| 5,138,274 A | 8/1992 | Nakanishi et al. | |
| 5,144,258 A | 9/1992 | Nakanishi et al. | |
| 5,182,527 A * | 1/1993 | Nakanishi et al. | 330/285 |
| 5,192,919 A * | 3/1993 | Wieczorek | 330/129 |
| 5,196,806 A | 3/1993 | Ichihara | |
| 5,204,613 A | 4/1993 | Cripps et al. | |
| 5,251,330 A * | 10/1993 | Chiba et al. | 455/91 |
| 5,311,143 A | 5/1994 | Soliday | |
| 5,337,006 A * | 8/1994 | Miyazaki | 330/130 |
| 5,381,115 A | 1/1995 | Timmons et al. | |
| 5,404,586 A * | 4/1995 | Ishiguro | 455/126 |
| 5,422,598 A * | 6/1995 | Maeda et al. | 330/136 |
| 5,442,317 A | 8/1995 | Stengel | |
| 5,446,756 A * | 8/1995 | Mallinckrodt | 375/130 |
| 5,559,471 A * | 9/1996 | Black | 330/277 |
| 5,604,924 A | 2/1997 | Yokoya | |
| 5,613,229 A * | 3/1997 | Baranowski et al. | 455/127.1 |
| 5,629,648 A | 5/1997 | Pratt | |
| 5,640,691 A * | 6/1997 | Davis et al. | 455/126 |
| 5,659,893 A * | 8/1997 | Enoki et al. | 455/126 |
| 5,678,209 A * | 10/1997 | Strakovsky | 455/126 |
| 5,689,815 A * | 11/1997 | Yamazaki et al. | 455/69 |
| 5,710,519 A | 1/1998 | McCalpin et al. | |
| 5,732,334 A * | 3/1998 | Miyake | 455/126 |
| 5,745,016 A | 4/1998 | Salminen | |
| 5,757,226 A | 5/1998 | Yamada et al. | |
| 5,757,237 A * | 5/1998 | Staudinger et al. | 330/296 |
| 5,774,797 A * | 6/1998 | Kawano et al. | 455/127.2 |
| 5,777,519 A | 7/1998 | Simopoulos | |
| 5,808,515 A | 9/1998 | Tsuruoka et al. | |
| 5,834,977 A | 11/1998 | Maehara et al. | |
| 5,892,396 A | 4/1999 | Anderson et al. | |
| 5,892,397 A | 4/1999 | Belcher et al. | |
| 5,892,403 A | 4/1999 | Brandt | |
| 5,955,926 A | 9/1999 | Uda et al. | |
| 5,986,509 A | 11/1999 | Lohninger | |
| 5,990,751 A | 11/1999 | Takita | |
| 6,034,519 A | 3/2000 | Yang | |
| 6,049,703 A * | 4/2000 | Staudinger et al. | 455/114.3 |
| 6,052,020 A | 4/2000 | Doyle | |
| 6,064,269 A | 5/2000 | Ruppel et al. | |
| 6,121,842 A | 9/2000 | Adlerstein et al. | |
| 6,148,220 A | 11/2000 | Sharp et al. | |
| 6,150,872 A | 11/2000 | McNeill et al. | |
| 6,163,706 A | 12/2000 | Rozenblit et al. | |
| 6,201,445 B1 | 3/2001 | Morimoto et al. | |
| 6,239,658 B1 | 5/2001 | Tham | |
| 6,242,983 B1 | 6/2001 | Shiao | |
| 6,265,943 B1 | 7/2001 | Dening et al. | |
| 6,362,605 B1 | 3/2002 | May | |
| 6,624,702 B1 * | 9/2003 | Dening | 330/297 |

* cited by examiner

BATTERY LIFE EXTENDING TECHNIQUE FOR MOBILE WIRELESS APPLICATIONS USING BIAS LEVEL CONTROL

CROSS-REFERENCE TO RELATED APPLICATIONS

This application is a continuation of U.S. application Ser. No. 09/664,878, which was a continuation of U.S. application Ser. No. 08/843,107, entitled "Battery Life Extending Technique For Mobile Wireless Applications," now U.S. Pat. No. 6,148,220, issued on Nov. 14, 2000, and incorporated herein by reference.

FIELD OF THE INVENTION

This invention relates to wireless transmitters and, in particular, to a technique for extending the battery life in such a transmitter.

BACKGROUND

Extending battery life is a key concern for users and manufacturers of cellular telephones and other portable transceivers. A powerful signal generated and transmitted by the wireless transceiver draws more power from the battery than when a lower power signal is generated and transmitted. Accordingly, a number of prior art techniques have been employed to adjust the gain of a portable transmitter so as to not transmit a signal more powerful than necessary for adequate communications. Examples of such ways of automatically adjusting the output power level of a transmitter are described in U.S. Pat. Nos. 4,760,347, 5,129,098, and 5,446,756, incorporated herein by reference.

Although the prior art techniques selectively reduce the output power of the transmitter, the efficiency of the transmitter is not improved by the prior art methods. The transmitter is typically biased, and operating voltages are set, so that the transmitter output signal will not distort in an adverse way at the highest expected output signals. These worse case operating conditions can draw significant power from the battery even when no signal is being transmitted. Such worst case operating conditions are not required when the transmitter is not transmitting its maximum signal. Hence, the transmitter's efficiency is lower when transmitting lower power output signals. A lower efficiency equates to wasting battery power, reducing talk time.

What is needed is a technique for extending the battery life in mobile wireless applications.

SUMMARY

A technique is described herein which dynamically reduces the operating voltage applied to a transmitter's power amplifier in a mobile wireless transceiver so as to increase the efficiency of the transmitter when the transmitter is not outputting its maximum output power. Thus, the total power consumption of the transmitter is reduced as compared to prior art transmitters. In another embodiment, the bias voltage or bias current levels within the transmitter are also varied to optimize the efficiency of the transmitter at a particular output power level. This technique of controlling the transmitter's operating voltage and bias voltage/current may be used in conjunction with conventional techniques for automatically reducing the gain of the transmitter.

In a preferred embodiment, a highly efficient switching regulator is controlled by a control circuit to adjust the operating voltage and bias voltage/current for the power amplifier in the transmitter. The control circuit has as its input any of a variety of signals which reflect the actual output of the transmitter or the desired output power of the transmitter.

DETAILED DESCRIPTION OF THE PREFERRED EMBODIMENTS

Figure 1:
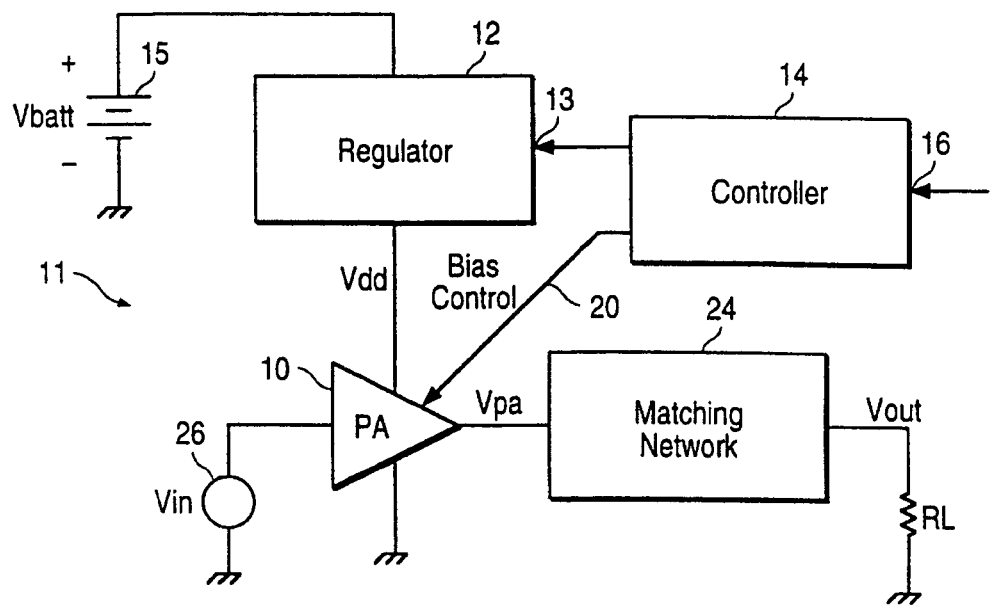
FIG. 1 is a block diagram of the basic components of a transmitter section in a wireless transceiver incorporating one embodiment of the present invention.

FIG. 1 illustrates a power amplifier 10 for a transmitter 11 whose operating voltage Vdd is provided by a variable voltage regulator 12. The output voltage Vdd of regulator 12 is controlled by a signal from a controller 14 applied to a control terminal 13. A battery 15 supplies power to regulator 12.

Controller 14 receives a signal at an input terminal 16 which signifies the actual output power of the power amplifier 10, the desired output power of amplifier 10, or a measure of the output voltage swing of amplifier 10. Controller 14 then sets, based on this input signal, the output voltage Vdd of regulator 12 such that amplifier 10 will operate under its most efficient conditions for the particular output power level.

Controller 14 also, optionally, provides a bias voltage or bias current control signal to amplifier 10 via line 20 to adjust the bias current or voltage levels in amplifier 10 for optimum efficiency at a particular output power level.

When amplifier 10 is outputting its maximum power level, the output voltage Vpa swing of amplifier 10 is a maximum, and amplifier 10 operates with relatively high efficiency. The various transistors and other components in amplifier 10 are biased and otherwise operated so as not to introduce significant distortion into the output signal. As the output power is reduced, the output voltage swing and current drawn from battery 15 are reduced. In accordance with one embodiment of the invention, because of the reduced output voltage swing, the operating voltage Vdd provided to amplifier 10 by regulator 12 is reduced, without introducing distortion, to save additional power.

Further, in accordance with one embodiment of the invention, as the power output level is reduced, the bias voltages and currents are also reduced, without introducing distortion, to save additional power.

Power consumption is the product of the RMS voltage and current drawn from battery 15. Hence, by reducing the RMS voltage to amplifier 10, power consumption is reduced beyond that provided by prior art power consumption techniques. Because cellular telephones generally operate at less than full power most of the time, using the invention shown in FIG. 1 will extend the life of battery 15 significantly.

A matching network 24 (e.g., a resonant circuit) interfaces the output of amplifier 10 to a load RL. Load RL may be an antenna or other load. An input signal generator 26 generates a modulated RF signal Vin in a conventional way and may include automatic gain control circuitry.

FIGS. 2-6 illustrate some of the techniques which may be used by controller 14 to detect the output power or desired output power of amplifier 10 in order to suitably control regulator 12 to generate a variable Vdd for amplifier 10 or to control the bias settings in amplifier 10.

Figure 2:
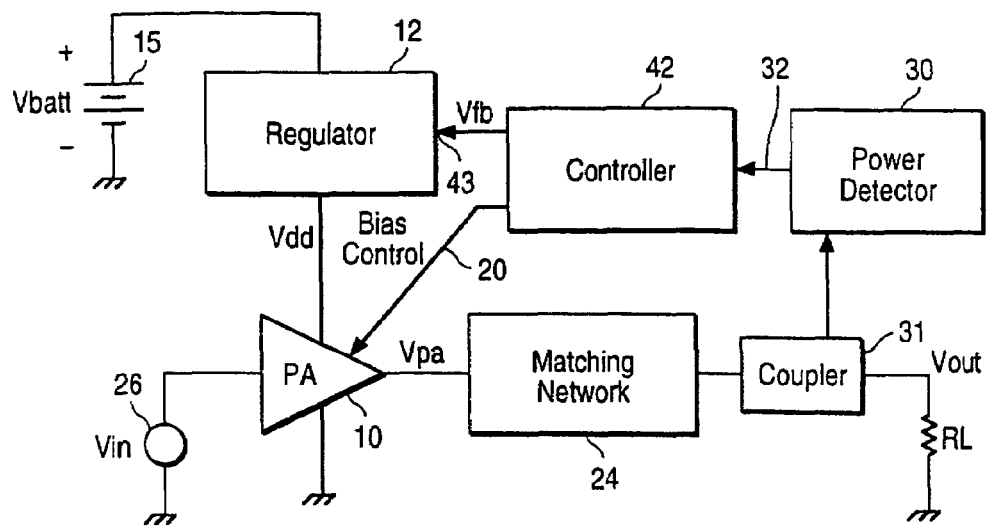
FIGS. 2-6 illustrate various embodiments of controllers for controlling an output of a voltage regulator for application to a power amplifier in a wireless transceiver.

In FIG. 2, a power detector 30 is connected to the output of power amplifier 10 or to the output of the matching network 24, via a coupler 31, to generate a voltage at lead 32 related to the output power of amplifier 10. Coupler 31 couples a small percentage of the output signal to the power detector 30. Power detectors are well known and may take many forms. Controller 42 converts the signal on lead 32 into a control signal for regulator 12 for adjusting Vdd to optimize the efficiency of amplifier 10.

Controller 42 may be coupled to a feedback terminal 43 of regulator 12, where the feedback signal Vfb has a predetermined relationship with the voltage on lead 32. Thus, controller 42 may simply be a level shifter or suitable amplifier. By appropriate design of the power detector 30, the feedback terminal 43 of regulator 12 may instead be directly connected to lead 32, so that the power detector 30 acts as the controller. The relationship between the input of controller 42 and the output of controller 42 is to be determined based upon the particular regulator 12 and power amplifier 10 used.

Some cellular telephones and other wireless transceivers already employ an output power detector for another purpose, and, thus, the present invention may be easily incorporated into such devices.

Regulator 12 may be any conventional high-efficiency switching regulator which provides an output voltage based upon a feedback signal, as is well-known in the art. In conventional voltage regulator circuits, the feedback terminal of a regulator is connected to a divided regulated output voltage.

Figure 3:
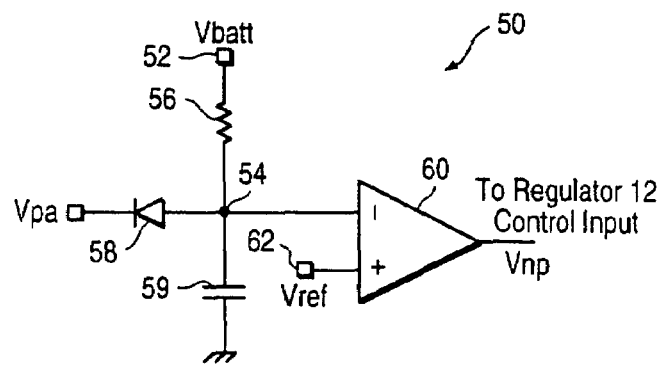

FIG. 3 illustrates a controller 50 which senses the output voltage Vpa of amplifier 10 and essentially acts as a negative peak detector to output a voltage Vnp representative of the most negative output of amplifier 10 over a period of time. The battery voltage Vbatt applied to terminal 52 slowly pulls up node 54 to the battery voltage through resistor 56. Voltages applied to the cathode of diode 58 which are lower than one diode drop below the voltage at node 54 pull down the voltage at node 54 to approximately the most negative voltage applied to terminal 52 plus a diode drop. The selection of the resistor 56 value and the capacitor 59 value determines the response of controller 50. The RC time constant is preferably set so that there is no appreciable change at node 54 from cycle to cycle.

The voltage at node 54 is applied to one input terminal of an amplifier 60, and a reference voltage 62 is applied to another input terminal. The output of amplifier 60 is applied to the feedback terminal of regulator 12. In response, regulator 12 provides an operating voltage Vdd to amplifier 10 so as to maintain the voltage at node 54 at approximately Vref. If Vref is held fixed, then controller 50 acts to regulate the minimum voltage across the amplifier 10 output transistor(s) needed to avoid adverse distortion, thus optimizing the amplifier's efficiency at all output power levels. The technique of FIG. 3 may be used to control the minimum voltage across the transistors in all stages of amplifier 10 (e.g., transistors Q1 and Q2 in FIG. 10). For example, with reference to FIG. 10, the minimum drain-source voltage across transistors Q1 and Q2 to allow transistors Q1 and Q2 to operate in a linear region is regulated using the circuit of FIG. 3. A buffer may be needed between the output of amplifier 10 and the input of controller 50 to avoid undue loading.

Figure 4:
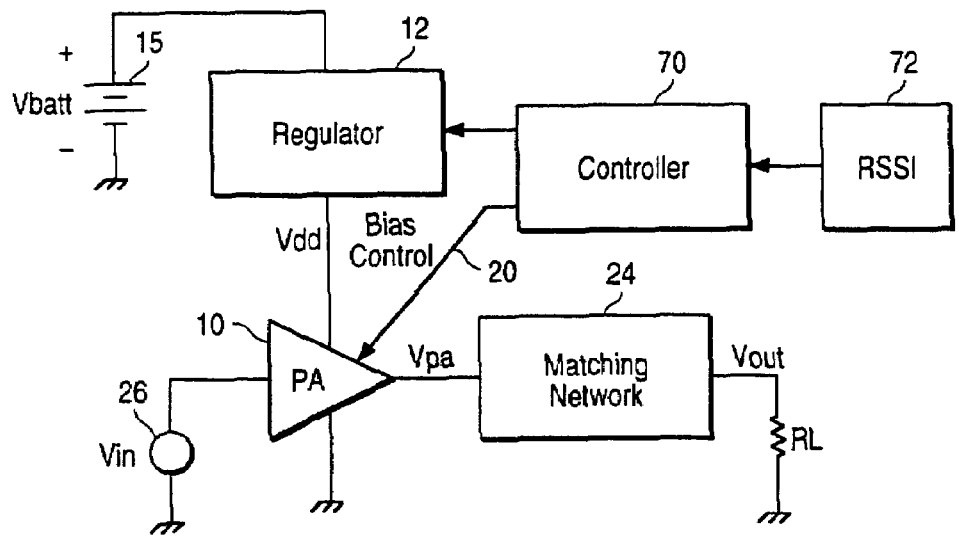

FIG. 4 illustrates a controller 70 for regulator 12 which receives as its input a receive signal strength indication (RSSI), provided by a conventional RSSI circuit 72 which generates a voltage indicating the strength of a received signal. The strength of the received signal is, in certain cases, indicative of the required power to be transmitted for adequate two-way communication. This is especially true when the remote originating transmit power is known. The wireless transceiver may already contain a RSSI circuit 72 for a different purpose. A higher RSSI signal thus indicates to controller 70 to provide a feedback signal to regulator 12 to lower the voltage Vdd to amplifier 10 to improve the efficiency of amplifier 10 at the lower output power.

Figure 5:
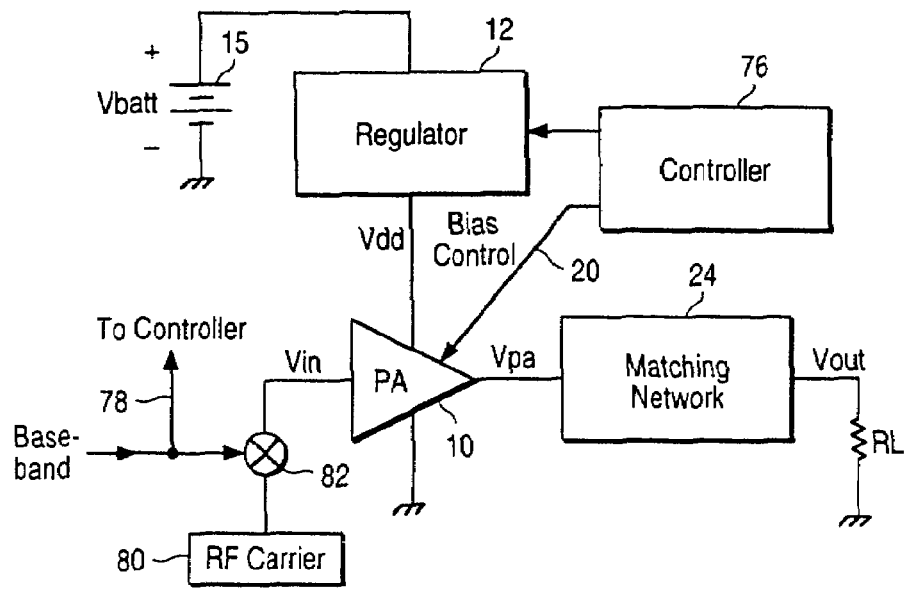

FIG. 5 illustrates how an input into controller 76 may be the baseband signal 78 which is mixed with the modulating RF carrier, generated by modulator 80, by multiplier 82. Since the output power of amplifier 10 varies with the amplitude of the baseband signal 78, controller 76 may cause regulator 12 to modulate the voltage Vdd into amplifier 10 in accordance with the baseband signal. The technique of FIG. 5 is only applicable for forms of modulation which have non-constant envelopes.

Figure 6:
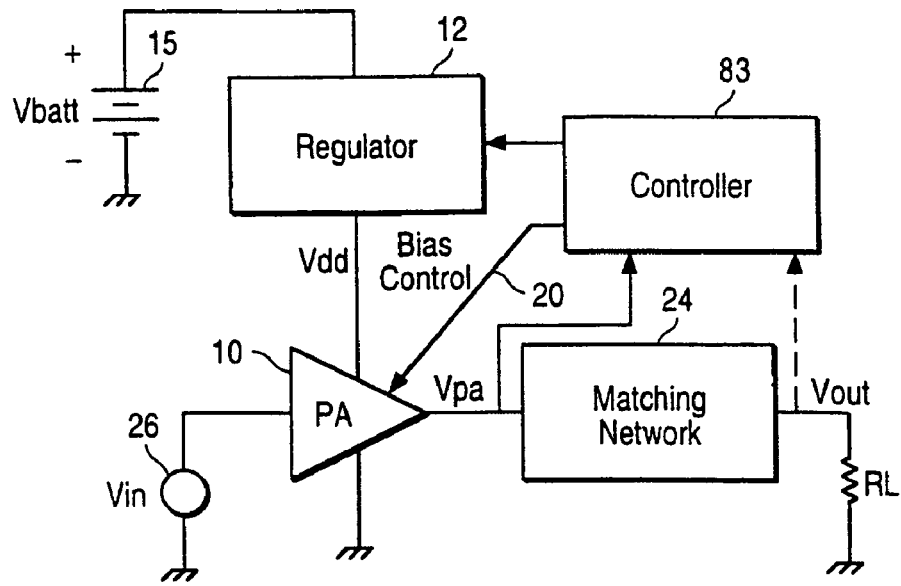

In another embodiment, shown in FIG. 6, controller 83 receives its signal directly from the output of amplifier 10 or the matching network 24. Controller 83 converts this signal level into a control signal for regulator 12.

Other forms of controllers would be suitable depending upon the specific transmitter to be controlled.

Figure 7:
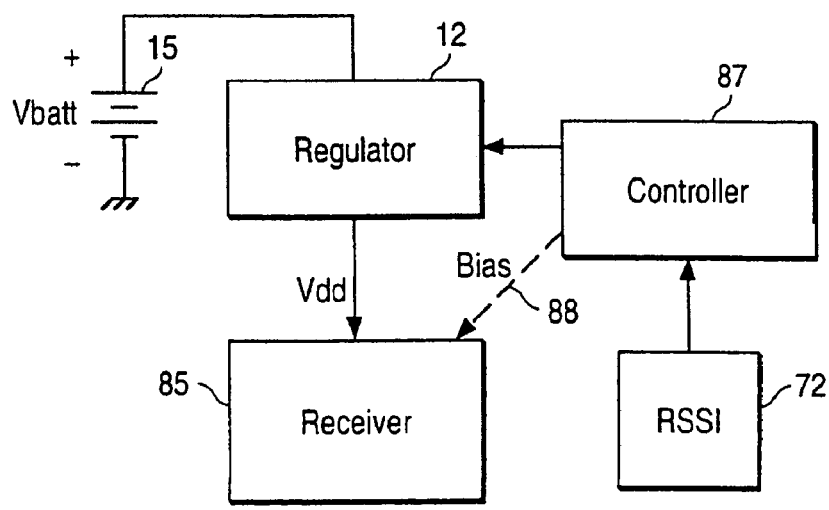
FIG. 7 illustrates one embodiment of a controller for controlling an output voltage of a voltage regulator for application to a receiver in a wireless transceiver.

FIG. 7 illustrates a receiver 85 in a wireless transceiver which receives its operating voltage Vdd from regulator 12. Controller 87 controls the output of regulator 12 to improve the efficiency of receiver 85 at lower received signal levels. A lower strength received signal, detected by RSSI circuit 72, lowers the Vdd applied to receiver 85 to optimize efficiency. Bias voltage/current levels may also be adjusted by controller 87 via line 88.

Figure 8:
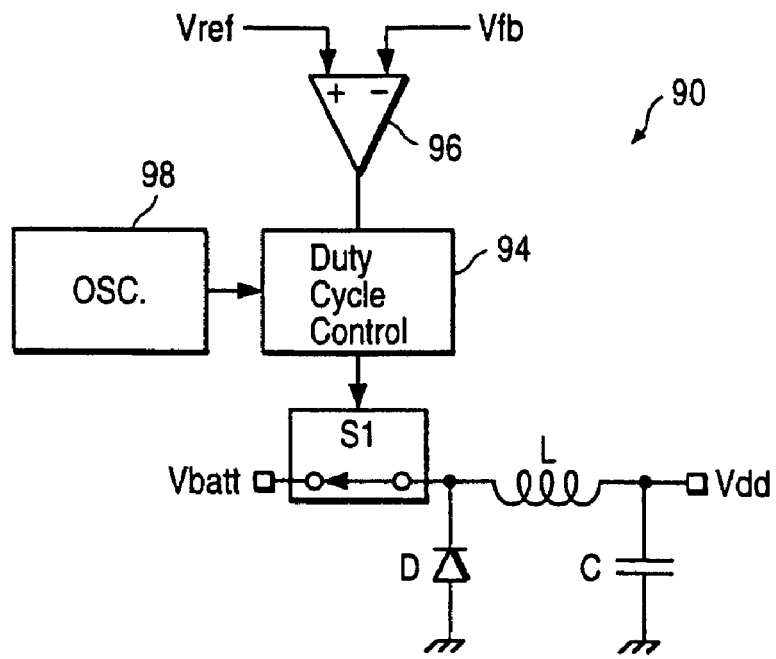
FIGS. 8 and 9 illustrate a conventional buck type regulator and a boost type regulator, respectively.
Figure 9:
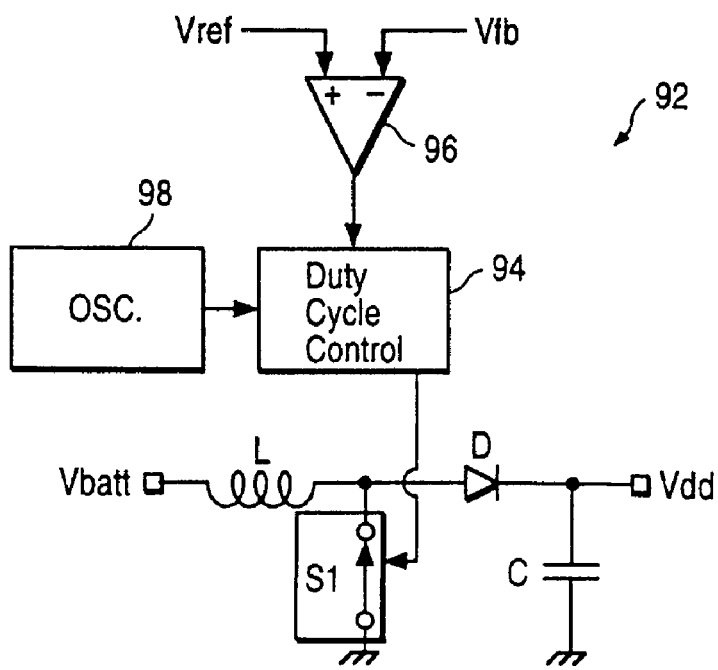

FIGS. 8 and 9 illustrate two types of simple switching regulators: FIG. 8 illustrates a buck type regulator 90, and FIG. 9 illustrates a boost type regulator 92. Such regulators may be used for regulator 12 in the various figures. In such regulators, the duty cycle of the switch S1 (typically a switching transistor) is controlled, where the duty cycle is directly proportional to the output voltage Vdd of the regulator. A duty cycle controller 94 controls the switching of S1 based upon a feedback signal Vfb from any of the controllers shown in FIGS. 1-7. A reference voltage Vref is compared to the feedback signal by amplifier 96 for adjusting the duty cycle of switch Si. An oscillator 98 provides the switching frequency of switch S1. Those skilled in the art are familiar with the operations of the regulators of FIGS. 8 and 9. A boost-buck regulator may also be used, which is typically a combination of the circuits of FIGS. 8 and 9.

Figure 10:
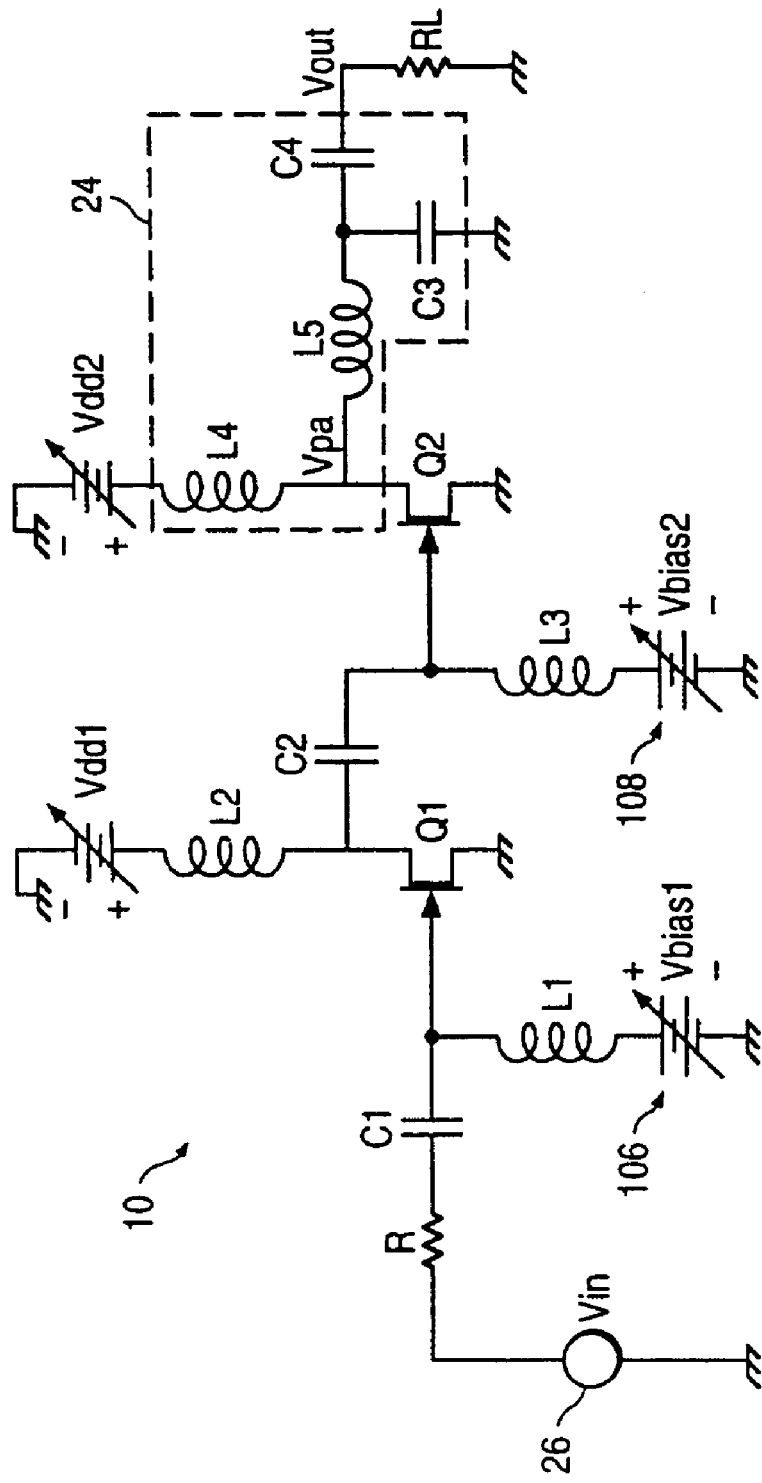
FIG. 10 illustrates one embodiment of a power amplifier which has its efficiency improved using the present invention.

FIG. 10 illustrates one of the many appropriate types of power amplifiers 10 which may be used with the present invention. A modulated RF input signal from generator 26 is supplied through resistor R and capacitor C1 to the input of a field effect transistor Q1. A variable bias voltage generator 106, controlled by controller 14 in FIG. 1, provides a bias voltage for operating transistor Q1 around a certain operating. point. Inductor L1 and capacitor C1 form an input matching network for transistor Q1. The signal generated at the drain of transistor Q1 is provided to the gate of transistor Q2, via DC blocking capacitor C2, for further amplification. Inductor L2, inductor L3, and capacitor C2 form a matching network between transistors Q1 and Q2.

The drain of transistor Q2 provides the output Vpa of amplifier 10. A second variable bias voltage generator 108, controlled by controller 14 in FIG. 1, provides a bias voltage for operating transistor Q2 around a certain operating point. The drain of transistor Q2 is connected to a matching network 24 for appropriate resonant tuning to improve gain, lower the return loss, lower distortion, increase output power, and increase efficiency. The matching network 24 consists of inductor L4 connected between Vdd2 and transistor Q2, inductor L5, and capacitors C3 and C4. The voltage output Vout is then applied across a load RL (e.g., an antenna) for transmission.

The operating conditions of transistors Q1 and Q2 must be set so that the voltage swings and/or drain currents of transistors Q1 and Q2 are not distorted in an unacceptable way. The adjustable bias voltages Vbias1 and Vbias2 as well as voltages Vdd1 and Vdd2 are therefore dynamically controlled to avoid such distortion of the signals provided by transistors Q1 and Q2. Suitably controlling the operating conditions using the present invention results in less battery power being wasted through the various conduction paths.

The variable voltage sources (e.g., controllable regulators) used for sources 106 and 108 may be conventional. The particular bias voltages needed at various output power levels are determined on a case-by-case basis depending upon the particular amplifier and application.

The controller 14 (FIG. 1) may control the output of regulator 12 to set the Vdd1 and Vdd2 levels to be the same or different, depending on the minimum voltage needed to operate transistors Q1 and Q2 at low distortion at a particular output power.

In the example shown in FIG. 10, transistors Q1 and Q2 are metal-semiconductor field effect transistors (MESFETs).

A power amplifier using bipolar technology may also utilize the present invention, where the collector-emitter voltage Vce of the amplifier's transistor(s) is regulated to be a minimum needed to operate the transistor(s) at all output levels without distortion. Such an amplifier may replace the MESFET transistors Q1 and Q2 in FIG. 10 with bipolar transistors. MOSFET transistors may also be used.

This technique of dynamically adjusting the operating conditions in an amplifier may be applied to many forms of power amplifiers, and the particular type of controller used will depend upon the method which will provide the most efficient use of battery power at a reasonable cost. Many of the circuits which generate the input to controller 14 (FIG. 1) already exist in certain cellular telephones, such as the power detection circuit 30 of FIG. 2 and the RSSI circuit 72 of FIG. 4. The present invention is not restricted to any particular switching regulator (e.g., PWM, PFM), and a suitable regulator may also be a non-switching regulator, such as a linear regulator. However, switching regulators are known to be highly efficient.

It is expected that the present invention will increase the battery life of cellular telephones and other wireless transceivers by as much as 50% or more. In some applications, it is anticipated that battery life will be at least doubled using the present invention.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A mobile wireless device comprising:
   an amplifier coupled to receive a first signal, the first signal being amplified in the amplifier, and to provide the amplified first signal to an antenna of the wireless device through an output matching network;
   a switching voltage regulator circuit having an input terminal coupled to receive a DC voltage provided by a battery, and an output voltage terminal that sources a first variable voltage signal across terminals of a transistor of the amplifier;
   a bias voltage generator that generates a second variable DC voltage signal that is provided to an input of the transistor; and
   a controller having an input terminal connected to receive a signal,
   wherein the signal is sampled between the output of the amplifier and the antenna, the controller receives a second signal based on said sampling, the controller provides a third signal to the switching voltage regulator that determines the first variable voltage signal, and the controller provides a fourth signal to the bias voltage generator that determines the second variable voltage signal, the third and fourth signals being dependent on a value of the signal.

2. The mobile wireless device of claim 1, wherein the signal is sampled between the output of the amplifier and the output matching network.

3. The mobile wireless device of claim 1, wherein the signal is sampled between the output matching network and the antenna.

4. A mobile wireless device comprising:
   an amplifier coupled to receive a first signal, the first signal being amplified in the amplifier, and to provide the amplified first signal to an antenna of the wireless device through an output matching network;
   a switching voltage regulator circuit having an input terminal coupled to receive a DC voltage provided by a battery, and an output voltage terminal that sources a first variable voltage signal across terminals of a transistor of the amplifier;
   a bias circuit that generates a second variable DC voltage signal that is provided to an input of the transistor; and
   a controller,
   wherein the switching voltage regulator is coupled to an output of the controller, and receives a signal from the controller that determines the first variable voltage signal, the controller determining said signal based on a strength of a signal received by the mobile wireless device from another transmitter, and
   wherein the bias circuit is coupled to an output of the controller, and receives a signal from the controller that determines the second variable voltage signal, the controller determining said signal based on the strength of the signal received by the mobile wireless device from the other transmitter.

* * * * *